United States Patent [19]
Lien et al.

[11] Patent Number: 6,065,973
[45] Date of Patent: May 23, 2000

[54] MEMORY CELL HAVING ACTIVE REGIONS WITHOUT N+ IMPLANTS

[75] Inventors: Chuen-Der Lien, Los Altos Hills; Pailu D. Wang, San Jose, both of Calif.

[73] Assignee: Integrated Decice Technology, Inc., Santa Clara, Calif.

[21] Appl. No.: 08/802,512

[22] Filed: Feb. 20, 1997

Related U.S. Application Data

[62] Division of application No. 08/651,231, May 22, 1996.

[51] Int. Cl.$^7$ .................................................. H01L 21/8244
[52] U.S. Cl. .................... 437/52; 437/40 AS; 437/41 AS
[58] Field of Search ................................. 437/52, 40 AS, 437/41 AS; 257/903–906; 148/DIG. 20

[56] References Cited

U.S. PATENT DOCUMENTS

| | | | |
|---|---|---|---|
| 5,196,233 | 3/1993 | Chan et al. | 437/52 |
| 5,206,532 | 4/1993 | Roberts | 257/382 |
| 5,489,790 | 2/1996 | Lage | 257/903 |
| 5,494,848 | 2/1996 | Chin | 437/191 |

OTHER PUBLICATIONS

Belgal et al., "A New Mechanism of Pipeline Defect Formation in CMOS Devices", IEEE/IRPS, 1991 pp. 399–404.
Wang et al., "Pipeline Defects in CMOS Mosfet Devices Caused by SWAMI Isolation", IEEE/IRPS, 1992, pp. 85–90.

*Primary Examiner*—Jey Tsai
*Attorney, Agent, or Firm*—Skjerven, Morrill, MacPherson, Franklin, & Friel

[57] ABSTRACT

Lightly doped active regions in a semiconductor structure reduce occurrences of pipeline defects. The light doped active region are typically employed where performance is not adversely affected. For example, in memory cells, pass transistors have lightly doped drains which directly connect to bit lines. A pass transistor of this type can have the source more heavily doped than the drain. Alternatively, drains and sources of pass transistors are lightly doped. Drains of pull-down transistors can also be lightly doped. The difference in doping of active regions does not increase fabrication processing steps because conventionally active regions are formed by two doping steps to create a lightly doped portions adjacent gates where field strength is highest. The invention changes such processes by covering the desired lightly active regions with the mask used during a second doping process.

7 Claims, 5 Drawing Sheets

MEMORY CELL HAVING ACTIVE REGIONS WITHOUT N+ IMPLANTS

This application is a division of application Ser. No. 08/651,231, filed May 22, 1996.

BACKGROUND OF THE INVENTION

1. Field of the Invention

This invention relates to integrated circuit structures and processes for making integrated circuit structures and more particularly to processes for making static random access memory having fewer pipeline defects.

2. Description of Related Art

Integrated circuits having small feature size are sensitive to defects. For example, pipeline defects, which are conductive crystalline defects that underlie the gates of transistors and cause source-drain shorts, are more common in CMOS field effect transistors having short channel length. As described by H. Belgal et al., in "A New Mechanism of Pipeline Defect Formation in CMOS Devices", 1994 Proceedings of IEEE/IRPS, pp. 399–404; and by C. T. Wang et al., in "Pipeline Defects in CMOS Devices Caused by SWAMI Isolation" 1992 Proceedings of IEEE/IRPS, pp. 85–90, stresses from field oxidation and/or ion implantation near a transistor may cause crystalline defects under the transistor's gate. Dopants, metal, or hydrogen can enter and activate such crystalline defects to create a conductive path or short between the source and drain of the transistor.

Pipeline defects are a problem in memory cells such as the 4-transistor static random access memory (SRAM) cell 100 shown in FIG. 1. SRAM cell 100 contains a pair of N-channel pull-down transistors Q1 and Q2, a pair of pull-up resistors R1 and R2, and a pair of N-channel pass transistors Q3 and Q4. Pull-down transistors Q1 and Q2 connect respective nodes 110 and 120 to a reference voltage Vss (ground) and are cross-coupled so that the gate of transistor Q1 couples to the drain of transistor Q2 (node 120) and the gate of transistor Q2 couples to the drain of transistor Q1 (node 110). Pull-up resistors R1 and R2 connect respective nodes 110 and 120 to a supply voltage Vcc. In operation, memory cell 100 has two stable states distinguished by pull-down transistor Q1 or pull-down transistor Q2 being turned on. In both stable states, the voltage on node 110 is complementary to the voltage on node 120, i.e. the voltage on node 110 is high (near supply voltage Vcc) when the voltage on node 120 is low (near reference voltage Vss) and is low when the voltage on node 120 is high.

Pass transistors Q3 and Q4 are coupled between respective nodes 110 and 120 and respective bit lines 115 and 125 and have gates coupled to a word line 130. If SRAM cell 100 is selected, the voltage on word line 130 turns on pass transistors Q3 and Q4 and connects nodes 110 and 120 to respective bit lines 115 and 125. Voltages on nodes 110 and 120 change currents or voltages on bit lines 115 and 125 which are sensed during reading of SRAM cell 100. If SRAM cell 100 is not selected, the voltage on word line 130 is low to turn off pass transistors Q3 and Q4. However, if pass transistor Q3 or Q4 has a pipeline defect, the defective pass transistor Q3 or Q4 conducts and changes the voltages and currents on bit lines 115 and 125 even when SRAM cell 100 is not selected. Accordingly, pipeline defects in unselected cells can cause read errors.

Integrated circuit structures and processes are sought which reduce occurrences of pipeline defects.

SUMMARY OF THE INVENTION

In accordance with the invention, a low voltage semiconductor structure uses a light doping for some of source or drain regions. The resulting structure contains transistors that are less likely to have pipeline defects because the active regions of the transistors which have light dopant doses reduce stress caused by doping and thereby reduce the chance of forming a pipeline defect.

The light doping can be selectively provided in source or drain regions where the increased resistance and the lighter doping is not critical to performance of the circuit. For example, in a memory cell, a pass transistor has an active region (drain region) which connects to a bit line and can be lightly doped without greatly changing performance because during a write operation, the pass transistor connected to the high bit line operates in the saturation region where the light doping of the drain has little influence on the saturation current and little impact on performance. Alternatively, both source and drain regions of pass transistors can be lightly doped with or without the drains of pull-down transistors being lightly doped. Active regions which form the sources of pull-down transistors are typically more heavily doped to conduct a reference voltage across a cell.

In accordance with an aspect of the invention, a difference between the doping concentrations of various active regions in a semiconductor structure is achieved without increasing the number of processing steps. For example, one manufacturing process uses a first doping process, sidewall spacer formation, and then a second doping process to create transistors where sources and drains have small lightly doped portions at points under the sidewall spacers, where electric field strength is high. In this manufacturing process, a mask which conventionally exposes both source and drain regions to the second doping is expanded to cover selected active regions which remain only lightly doped.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the present invention, locations of heavily doped regions in a low voltage integrated structure are controlled to reduce occurrences of pipeline defects. For example, one of the source and drain regions of a transistor may be heavily doped but the other source or drain region is only lightly doped. Chances for forming pipeline defects under a gate of the transistor is reduced because the stress of high concentration doping affects only one side of the transistor.

In an exemplary semiconductor fabrication process, an initial light doping forms lightly doped active regions (source and drain regions) which are self-aligned with gate regions. After which, sidewall spacers are formed on the gates, and a second doping is performed. A photoresist mask is used during the second doping so that one or both of the source/drain regions is not doped twice and therefore remains lightly doped. For example, in four-transistor SRAM cell 100 of FIG. 1, the photoresist mask may cover the drain, source, or both drain and source of pass transistors Q3 and Q4. Additionally, the drains of pull-down transistors Q1 and Q2 may be only lightly doped. Typically, the sources of pull-down transistors Q1 and Q2 are heavily doped to maintain the speed at which transistors Q1 or Q2 pulls down a voltage at node 110 or 120.

Figure 2:
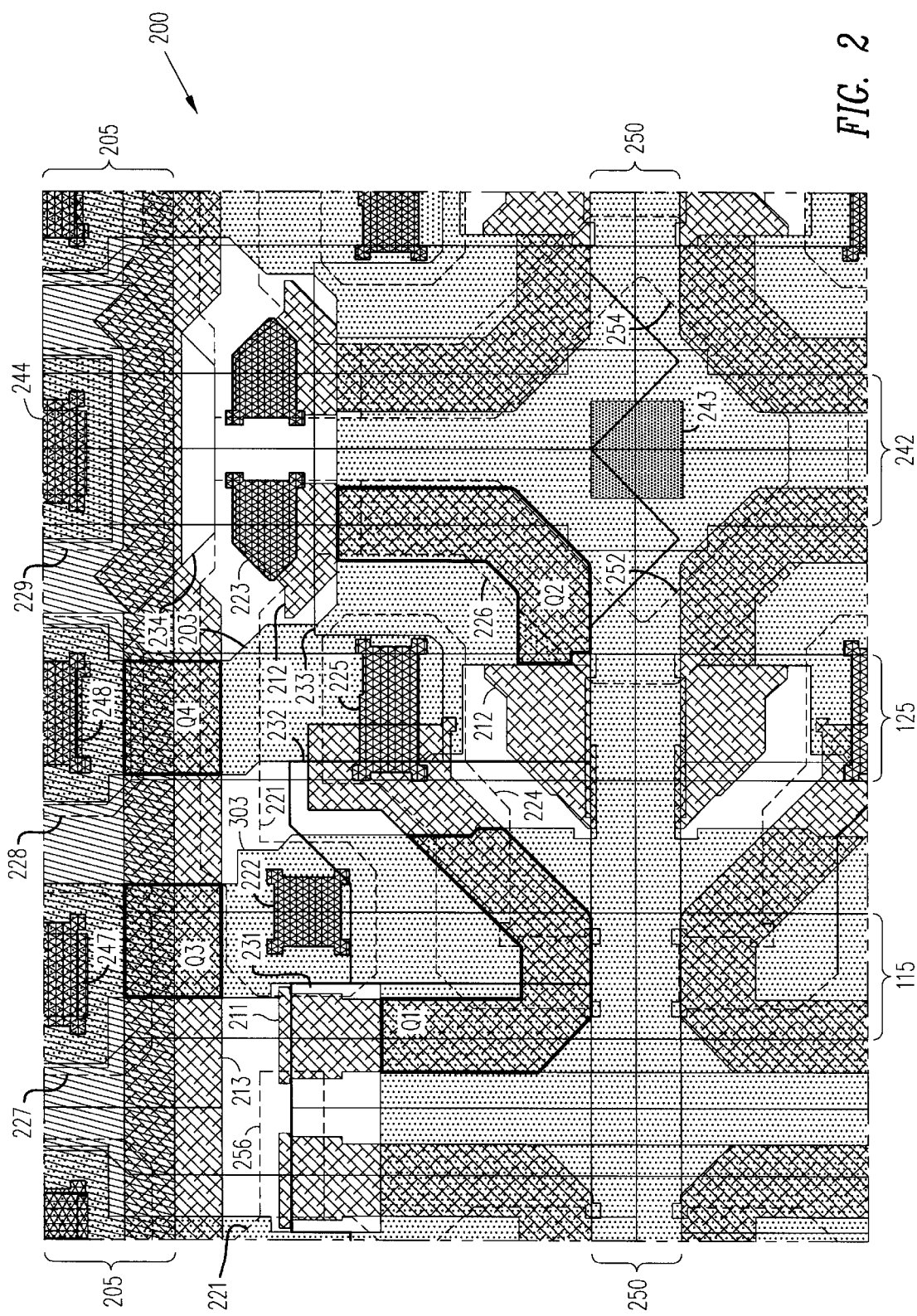
FIG. 2 shows layouts for structures which form a memory cell in accordance with an embodiment of the invention.

FIG. 2 shows layouts of structures formed and masks used during fabrication an SRAM cell 200. FIGS. 3A to 3E show cross-sections of a portion of SRAM cell 200 after selected steps during fabrication of SRAM cell 200. In the following, FIGS. 3A to 3E are described simultaneously with FIG. 2.

SRAM cell 200 includes doped active regions in a monocrystalline silicon substrate 300, regions formed from first and second polysilicon layers overlying the silicon substrate, and regions formed from a metal layer overlying the polysilicon layers. Regions formed from the first and second polysilicon layers are sometimes referred to herein as poly1 and poly2 regions respectively. Insulating layers which separate the substrate, the first polysilicon layer, the second polysilicon layer, and the metal layer from each other are indicated in FIG. 2 by vias which are formed in openings through the insulating layers.

Figure 3A:
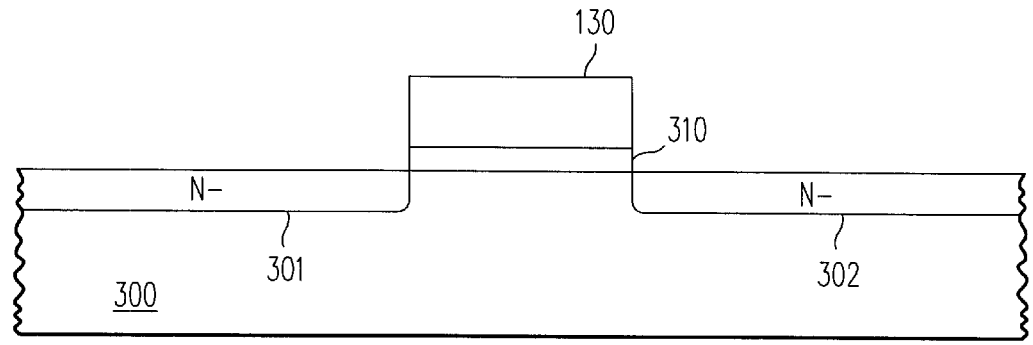
FIGS. 3A, 3B, 3C, 3D, and 3E show cross-sections of a portion of the memory cell of FIG. 2 during intermediates steps of a fabrication process in accordance with an embodiment of the invention.

A typical SRAM integrated circuit contains thousands or millions of cells which are substantially identical to SRAM cell 200. In particular, the layouts for cells adjacent to SRAM cell 200 are substantially reflections of the layouts shown for SRAM cell 200. Portions of SRAM cells adjacent to SRAM cell 200 illustrate similarities and differences between cells. Each cell contains a pair of N-channel pull-down transistors Q1 and Q2, a pair of pull-up resistors R1 and R2, and a pair of N-channel pass transistors Q3 and Q4 which operate as described above in regard to FIG. 1. The SRAM IC containing SRAM cell 200 is formed in and on silicon substrate 300 (FIG. 3A) which is initially processed in a well known manner to form field oxide regions (not shown) and isolation wells. Twin-well isolation in CMOS processes forms N wells for P channel devices and P wells for N channel devices. The portion of substrate 300 shown in FIGS. 2 and 3A is part of a P well having a dopant concentration of about $1 \times 10^{17}$ to $5 \times 10^{17}$ cm$^{-3}$ of boron. Optionally, an initial channel implant in the P well can adjust dopant concentration for channel regions to be formed.

After channel implants, a gate oxide layer 310 about 50 to 200 Å thick is grown or deposited on the surface of substrate 300, and a conventional technique such as chemical vapor deposition (CVD) deposits the first polysilicon layer to a thickness of about 1500 to 3500 Å on the gate oxide layer. The first polysilicon layer is doped to create a conductive layer having a resistance of 20 to 50 Ω/square. The first polysilicon layer may be doped by ion implantation, diffusion, in situ doping, or any other suitable technique. Additionally or alternatively, a metal such as nickel or tungsten may be sputtered or evaporated onto the surface of the first polysilicon layer before heating the structure to form a conductive silicide layer having a resistance typically lower than 20 Ω/square. The first polysilicon layer can be otherwise replaced with any conducting material suitable for forming gates of transistors.

The first polysilicon layer and gate oxide layer 310 are patterned to form poly1 regions such as poly1 regions 211, 212, and 213. Regions 211 and 212 form the gates of pull-down transistors Q1 and Q2. Region 213 forms a portion of word line 130 and constitutes the gates of pass transistors Q3 and Q4. FIG. 3A shows a cross-sectional view of transistor Q3 after patterning the first polysilicon layer to form word line 130 on gate oxide layer 310. The patterned poly1 layer is used as part of a mask for an ion implantation process which forms N− regions 301 and 302. In accordance with an exemplary embodiment of the invention, N− regions 301 and 302 are formed by implanting the substrate with a dose of $2 \times 10^{13}$ cm$^{-2}$ phosphorous ions at 80 KeV, but any light doping with a dose less than about $5 \times 10^{13}$ cm$^{-2}$ would be suitable.

Figure 3B:
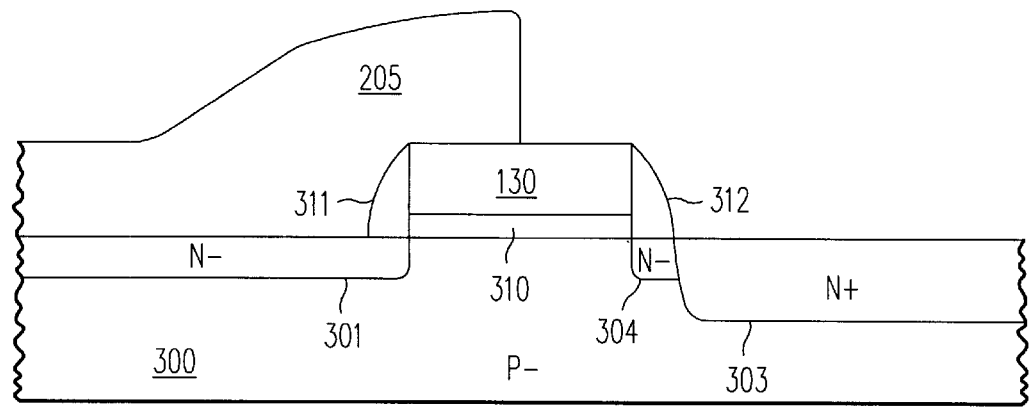

FIG. 3B shows sidewall spacers 311 and 312 that are then formed on the poly1 regions such as word line 130 and gate regions 211 and 212. Such sidewall spacers may be formed in a variety of ways including depositing a layer of silicon dioxide to a thickness of about 1000 to 3500 Å over the structure shown in FIG. 3A and then anisotropically etching the oxide layer until only sidewall spacers 311 and 312 remain. A photoresist mask 205 is then formed to protect selected N− active regions during formation of N+ active regions. In the embodiment of FIGS. 2 and 3B, photoresist layer 205 covers N− active regions such as region 301, which form the drains of pass transistors Q3 and Q4. References to source and drain regions used herein distinguish one current carrying terminal of a transistor from another but may not always correspond to the standard definitions of source and drain in terms of the electrical potentials on the terminals. The sources of pass transistors Q3 and Q4 and both the sources and drains of pull-down transistors Q1 and Q2 are exposed during formation of heavily doped active regions such as an N+ active region 303 which forms node 110, the source of pass transistor Q3, and the drain of pull-down transistor Q1. In a typical process, heavily doped active regions are exposed to a $5 \times 10^{15}$ cm$^{-2}$ dose of arsenic ions implanted at 150 KeV. Alternatively, any doping dose above about $2 \times 10^{14}$ cm$^{-2}$ can be employed. Ion implantation energies may be selected according to the desire depth of the active regions.

In the embodiment of FIGS. 2 and 3B, pass transistor Q3 has a drain (region 301) which is lightly doped and a source (region 303) which is heavily doped. The source additionally has a lightly doped portion 304 which underlies sidewall spacer 312 and reduces the chance of breakdown in a high electric field area near word line 130. Having only one side of transistor Q3 heavily doped reduces occurrences of pipeline defects because the stress of heavy doping is only applied to one side of transistor Q3 rather than both sides. It is believed that the dose or energy of implantation is the critical factor which leads to the formation of pipeline defects. In accordance with an aspect of the invention, at least one side of a transistor is not subjected to the higher dose and energy implants.

Light doping and resulting resistance of drain region 301 in pass transistor Q3 does not significantly reduce effective switching speed of pass transistor Q3 because higher resistance is limited to the drain side and does not significantly reduce the transistor's saturation current. However, the channel doping concentration can be adjusted if desired to increase switching speed.

Figure 3C:
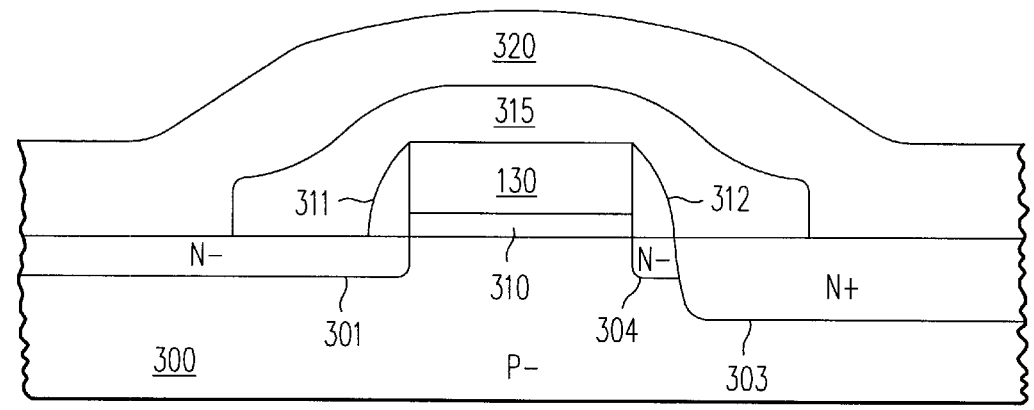
Figure 3D:
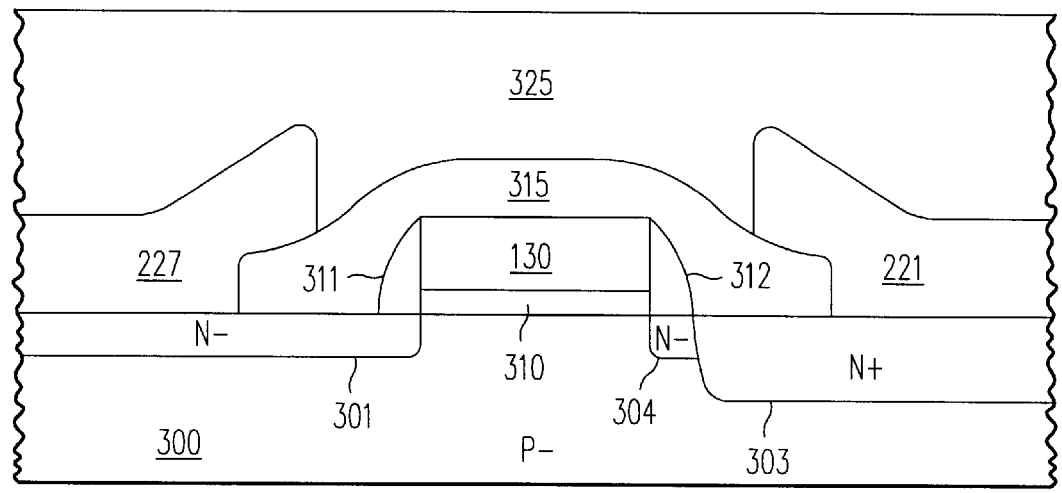
Figure 3E:
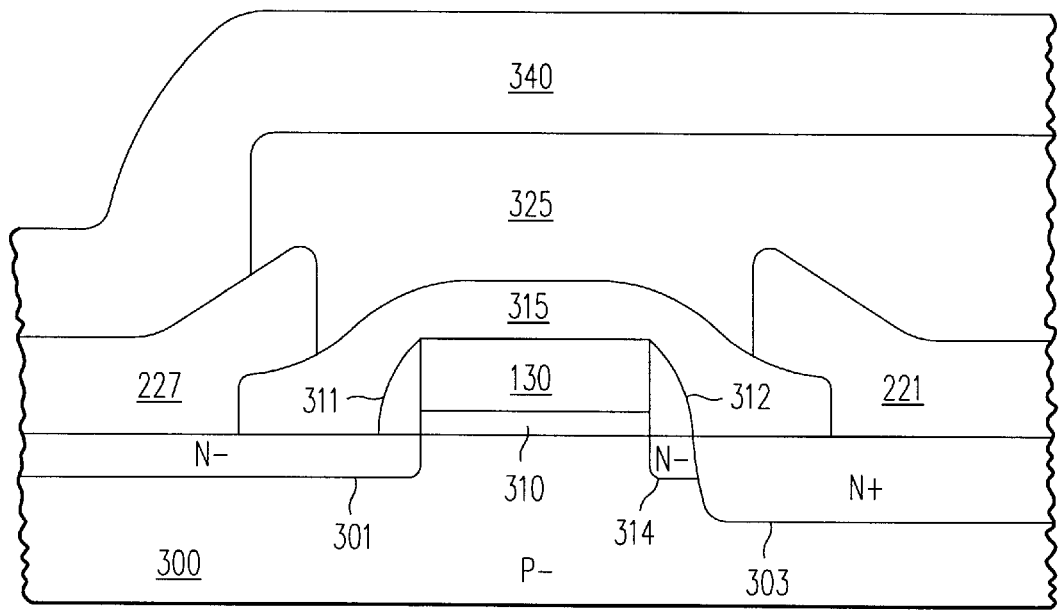

The remainder of SRAM cell 200 can be fabricated using conventional techniques. In the embodiment of FIGS. 2 and 3C, an insulating layer 315 made of a material such as silicon nitride, silicon dioxide, or glass is deposited to a thickness that could be less than 1000 Å but is preferably about 1000 to 3000 Å thick. Insulating layer 315 is then masked and etched to form openings for vias such as vias 222, 223, and 225. A second polysilicon layer 320 which is about 500 to 3000 Å thick is conformably deposited over insulating 315 layer and in the openings through insulating layer 315 to form vias 222, 223, and 225.

Second polysilicon layer 320 is masked and doped and/or silicided to increase conductivity in selected regions. In SRAM cell 200, mask regions 231 to 234 cover portions of second polysilicon layer 320 so that the covered portions of second polysilicon layer 320 remain resistive. The doping or silicide process makes exposed portions of the second polysilicon conductive. Second polysilicon 320 layer is patterned to form poly2 regions such as a cross-couple interconnect 221, resistive regions 224 and 226, contact pads 227, 228, and 229, and a supply voltage line 250. Cross-couple interconnect 221 includes vias 222 and 223 and is formed from a conductive portion of second polysilicon layer 320. Via 222 contacts substrate 300 at active region 303. Via 223 contacts poly1 region 212 which forms the gate of transistor Q2.

Pads 227, 228, and 229 contact substrate 300 at drain region 301 of pass transistor Q3, the drain region of pass transistor Q4, and an isolation well, respectively. Pads 227, 228, and 229 facilitate forming contacts with metal bit lines and ground lines described below.

Figure 1:
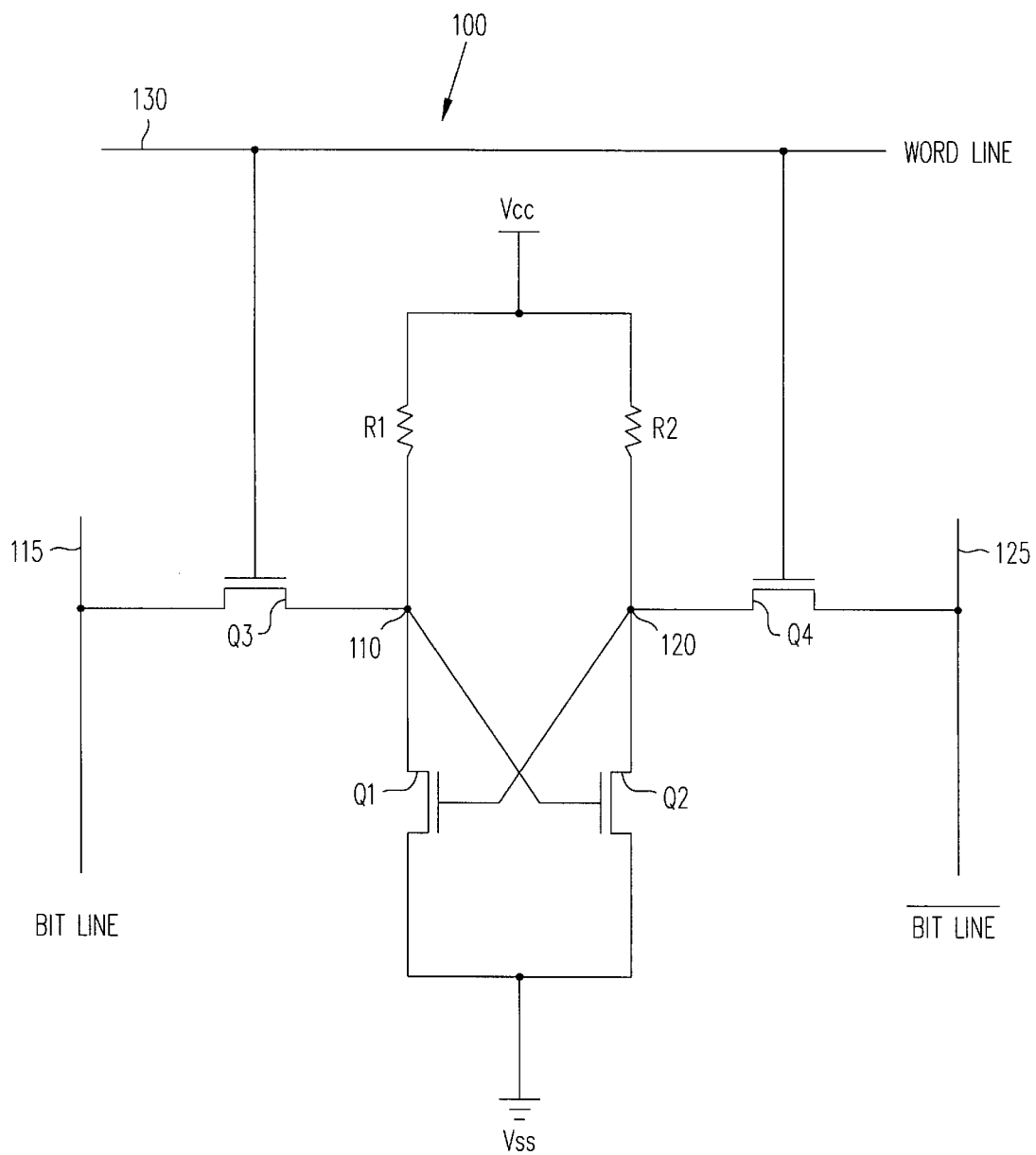
FIG. 1 shows a circuit diagram of a prior art four-transistor memory cell.

Poly2 regions 224 and 226 respectively form pull-up resistors R2 and R1 of FIG. 1. An edge of resistive poly2 region 226 is contiguous with cross-couple interconnect 221 so that resistor R1 connects node 110 to supply voltage Vcc. Poly2 region 224 includes strapping via 225 which contacts both poly1 gate region 211 and an active region 203 of substrate 300. Active region 203 forms node 120, the source of pass transistor Q4, and the drain of pull-down transistor Q2. U.S. patent application Ser. No. 08/567,649, entitled "Strapping Via for Interconnecting Integrated Circuit Structures", further describes strapping vias and is incorporated by reference herein in its entirety. Strapping via 225 is a conductive portion of the second polysilicon layer, but the majority of region 224 is resistive. Poly2 regions 224 and 226 have edges contiguous with supply voltage line 250 which provides supply voltage Vcc (typically less than about 5 volts) to memory cell 200.

Supply voltage line 250 is conductive and continuous to supply power to two rows of SRAM cells in an array. Conductive poly2 regions 252 and 254 are required in some cells so that supply line 250 can circumvent an area set aside for a via 243 from an overlying metal ground line 242 to substrate 300. Regions 252 and 254 occupy a portion of cell area which would be used for resistive poly2 region 226 if the adjacent SRAM cells were exactly symmetric to memory cell 200. In SRAM cells where regions 252 and 254 are required for continuity of supply voltage line 250, resistor R1 is formed by a poly2 region 256 which extends from a cross couple interconnect 221' to supply voltage line 250.

An insulating layer 325 (FIG. 3D) is formed over the entire structure including the poly2 regions. In one embodiment of the invention, insulating layer 325 includes an undoped insulating layer such as a glass, silicon dioxide, or silicon nitride layer about 1000 Å thick and a BPSG (boron-phosphorus-silicon glass) layer about 5000 Å thick. The BPSG layer is annealed at a temperature of about 850° C. for approximately 30 minutes to reduce the topography of the structure. After annealing, insulating layer 325 is further planarized, for example, by chemical mechanical polishing to provide a flat surface for a metal layer 340. Masking and etching of insulating layer 325 forms openings for vias such as vias 243, 244, 247, and 248.

A conventional process such as sputtering or evaporation forms metal layer 340 about 5000 Å thick on insulating layer 325. Metal layer 340 is patterned to form bit lines 115 and 125 and ground line 242. Openings in insulating layer 325 allow bit lines 115 and 125 to contact respective poly2 pads 227 and 228 which are electrically connected to drain regions of respective pass transistors Q3 and Q4. Ground line 242 includes vias 243 and 244. Via 243 directly contacts substrate 300 at an active region that forms sources of pull-down transistors Q1 and Q2. Ground line 242 through via 244 and poly2 pad 229 provides reference voltage Vss to bias the underlying isolation well.

A conventional passivation layer is applied over the patterned metal layer 340, and the structure is conventionally packaged to complete the SRAM IC.

Figure 4:
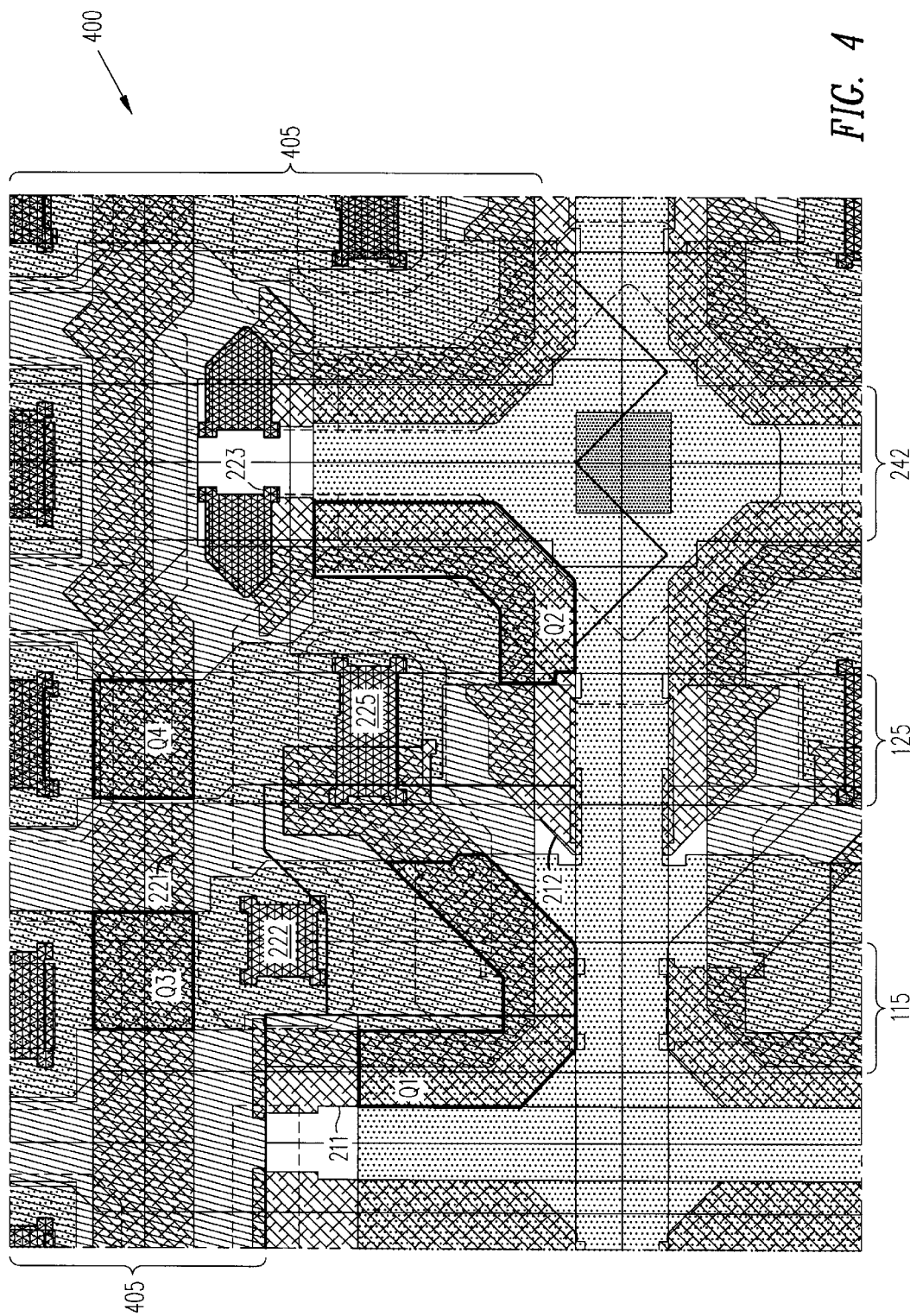
FIG. 4 shows layouts for structures which form a memory cell in accordance with another embodiment of the invention.

FIG. 4 shows an SRAM cell 400 which differs from SRAM cell 200 of FIG. 2 in that a mask layer 405 used during manufacture of SRAM cell 400 covers more of area than does mask layer 205 which is used during manufacture of SRAM cell 200. Mask layer 405 is otherwise used in the same fashion as mask layer 205. In particular, mask layer 405 is a layer of material such as photoresist which is formed after a light doping process and is patterned to protect selected areas of substrate 300 from a second doping process. Mask layer 405 covers source and drain regions of pass transistors Q3 and Q4 and the drain regions of pull-down transistors Q1 and Q2. Mask layer 405 exposes source regions of pull-down transistors Q1 and Q2 so that the source regions of pull-down transistors Q1 and Q2 are heavily doped. The light doping of source and drain regions of pass transistors Q3 and Q4 and the drain regions of pull-down transistors Q1 and Q2 reduces the chance of pipeline defects by reducing damage and stress caused by high dopant dosages.

Lower dopant doses used in embodiments of the invention increase resistance in the transistors. Retention of data in a SRAM cell is not affected by the resistance because current through pass transistors Q3 and Q4 should be zero and resistance in nodes 110 and 120 is effectively part of the resistance of pull up resistors R1 and R2. In memory cells 200 and 400, bit line contacts (drain regions of the pass transistors Q3 and Q4) have somewhat higher resistances; and in memory cell 400, nodes 110 and 120 also have lower doping. The higher resistances can affect reads and writes. Read speed is minimally effected because of the short distance that current must travel through the lightly doped regions to reach bit line contacts and because of the low current required for reading. During a write, the higher doping of the source regions enables pull-down transistors Q1 and Q2 to pull-down the nodes quickly.

Although the present invention has been described with reference to particular embodiments, the description is only an example of the invention's application and should not be taken as a limitation. In particular, even though much of preceding discussion was aimed at N channel devices where active regions where formed using N type dopants, alternative embodiments of this invention include P channel devices. Additionally, other types of pull-up devices such as P-channel transistor and other pull-down device can be employed in memory cells in accordance with embodiments of the invention. Various other adaptations and combinations of features of the embodiments disclosed are within the scope of the present invention as defined by the following claims.

We claim:

1. A method for forming a memory array comprising:

forming a first polysilicon layer overlying a silicon substrate;

patterning the first polysilicon layer to form word lines and gate regions;

lightly doping the silicon substrate to form source and drain regions adjacent the word lines and the gate regions;

forming a mask which covers drain regions to which bit lines will connect; and heavily doping active regions not covered by the mask.

2. The method of claim 1, wherein the mask covers source and drain regions of pass transistors.

3. The method of claim 2, wherein the mask covers drain regions of pull-down transistors.

4. The method of claim 1, further comprising forming sidewall spacers on the word lines, wherein the sidewall spacers are formed before the step of heavily doping active regions and stop portions of source regions adjacent the word line from being heavily doped.

5. The method of claim 1, where lightly doping comprises exposing active regions to a dosage less than about $5 \times 10^{13}$ cm$^{-2}$.

6. The method of claim 5, wherein heavily doping comprises exposing active regions not covered to a dosage greater than about $2 \times 10^{14}$ cm$^{-2}$.

7. The method of claim 1, wherein heavily doping comprises ion implantation, and lightly doping comprising ion implantation at an energy lower than that used when heavily doping.

* * * * *